United States Patent
Li

(10) Patent No.: US 12,513,814 B2
(45) Date of Patent: Dec. 30, 2025

(54) SYSTEM AND APPARATUS FOR FACILITATING ROBUST AUTOMOTIVE ETHERNET

(71) Applicant: Black Sesame Technologies (Chongqing) Co., Ltd., Chongqing (CN)

(72) Inventor: Hai Li, Shenzhen (CN)

(73) Assignee: BLACK SESAME TECHNOLOGIES (CHONGQING) CO., LTD., Chongqing (CN)

( * ) Notice: Subject to any disclaimer, the term of this patent is extended or adjusted under 35 U.S.C. 154(b) by 265 days.

(21) Appl. No.: 18/371,933

(22) Filed: Sep. 22, 2023

(65) Prior Publication Data
US 2024/0107660 A1    Mar. 28, 2024

(30) Foreign Application Priority Data
Sep. 26, 2022 (CN) .......................... 202211175968.9

(51) Int. Cl.
*H05K 1/02* (2006.01)
*H05K 1/18* (2006.01)

(52) U.S. Cl.
CPC ........... *H05K 1/0216* (2013.01); *H05K 1/181* (2013.01); *H05K 2201/10015* (2013.01); *H05K 2201/10022* (2013.01); *H05K 2201/1006* (2013.01)

(58) Field of Classification Search
CPC ...... H05K 1/02; H05K 1/0216; H05K 1/0245; H05K 1/18; H05K 1/181–184; H05K 2201/1006; H05K 2201/10015; H05K 2201/10022; H04L 12/10; H04L 12/12; H04L 12/40039; H04L 49/15; H04L 49/40; H04L 69/323
USPC ......... 361/760, 764, 782–784, 792–795, 803
See application file for complete search history.

(56) References Cited

U.S. PATENT DOCUMENTS

| | | | | |
|---|---|---|---|---|
| 5,719,750 | A * | 2/1998 | Iwane | H05K 1/0237 361/780 |
| 6,476,771 | B1 * | 11/2002 | McKinzie, III | H01Q 15/008 343/756 |
| 6,483,714 | B1 * | 11/2002 | Kabumoto | H01L 23/49838 174/250 |
| 7,764,149 | B2 * | 7/2010 | Han | H05K 1/0236 333/204 |

(Continued)

*Primary Examiner* — Tuan T Dinh
(74) *Attorney, Agent, or Firm* — Shun Yao; Yao Legal Services, Inc.

(57) ABSTRACT

Disclosed are an automotive Ethernet circuit board and communications system, and a vehicle. The automotive Ethernet circuit board includes: a component placement layer, configured to carry a PHY chip and a control chip of the PHY chip; a plurality of signal wiring layers, configured to carry signal wiring between components in the component placement layer; and a signal shielding layer, located between the plurality of signal wiring layers and configured to prevent interference of a clock signal in the signal wiring. In the embodiments of the present application, a plurality of signal wiring layers are used for signal wiring between components, and a plurality of complete signal shielding layers are used to prevent interference of a clock signal in the wiring. The embodiments help reduce signal crosstalk between PCBs, prevent interference of a clock signal in signal wiring, and improve stability and consistency of a data communications system.

17 Claims, 4 Drawing Sheets

(56) References Cited

U.S. PATENT DOCUMENTS

| | | | | |
|---|---|---|---|---|
| 7,943,864 B2* | 5/2011 | Kim | ................... | H01P 1/2005 |
| | | | | 174/262 |
| 8,022,313 B2* | 9/2011 | Lee | ................... | H05K 1/0236 |
| | | | | 174/260 |
| 8,791,371 B2* | 7/2014 | Choi | ................... | H05K 1/0225 |
| | | | | 174/262 |
| 2005/0030107 A1* | 2/2005 | Shimizu | ................ | H01L 23/66 |
| | | | | 330/307 |
| 2010/0108373 A1* | 5/2010 | Park | ................ | H01L 23/49822 |
| | | | | 29/830 |
| 2011/0096447 A1* | 4/2011 | Higuchi | .............. | H10D 89/611 |
| | | | | 361/56 |
| 2011/0132650 A1* | 6/2011 | Becker | ............. | H01L 21/76838 |
| | | | | 700/121 |
| 2020/0072889 A1* | 3/2020 | Pandey | .............. | G01R 31/3004 |
| 2021/0385095 A1* | 12/2021 | Raaijmakers | ......... | H02J 7/0045 |
| 2022/0123850 A1* | 4/2022 | Adrian | ................. | H04J 3/0697 |

\* cited by examiner

SYSTEM AND APPARATUS FOR FACILITATING ROBUST AUTOMOTIVE ETHERNET

RELATED APPLICATION

This application claims the benefit under 35 U.S.C. § 119(a) of the filing date of Chinese Patent Application No. 202211175968.9, filed in the Chinese Patent Office on Sep. 26, 2022. The disclosure of the foregoing application is herein incorporated by reference in its entirety.

TECHNICAL FIELD

Embodiments of the present application relate to the field of automotive Ethernet technologies, and more specifically, to an automotive Ethernet circuit board and communications system, and a vehicle.

BACKGROUND

With increasing popularity and complexity of a driving assistance system, a requirement for bandwidth of an automotive network is increasingly high, leading to a trend of gradually replacing a conventional CAN bus with an automotive Ethernet technology. An automotive Ethernet is a non-destructive arbitration communication network, and is also a new local area network technology that connects electronic units in a vehicle. The automotive Ethernet may significantly reduce system complexity, connection costs, and cabling weights. In addition, the automotive Ethernet has high frequency, high speed, and high signal quality requirements, and is sensitive to interference.

Because working environments inside and outside a vehicle are very complicated and harsh, signal crosstalk exists between automotive Ethernet circuit boards, which may cause communication abnormality and even loss of communication data.

SUMMARY

Embodiments of the present application provide an automotive Ethernet circuit board and communications system, and a vehicle. The following describes aspects of the embodiments of the present application.

According to a first aspect, an automotive Ethernet circuit board is provided, including: a component placement layer, configured to carry a PHY chip and a control chip of the PHY chip; a plurality of signal wiring layers, configured to carry signal wiring between components in the component placement layer; and a signal shielding layer, located between the plurality of signal wiring layers and configured to prevent interference of a clock signal in the signal wiring.

According to a second aspect, an automotive Ethernet communications system is provided, including the automotive Ethernet circuit board according to the first aspect.

According to a third aspect, a vehicle is provided, including the automotive Ethernet communications system according to the second aspect.

The automotive Ethernet circuit board in the embodiments of the present application is arranged in a multi-layer manner, a component placement layer for carrying a PHY chip and a core control chip is disposed, and a plurality of signal wiring layers are used to route signals between components. A plurality of complete signal shielding layers are used to prevent interference of a clock signal in signal wiring. The embodiments of the present application help reduce signal crosstalk between PCBs, prevent interference of a clock signal in wiring, and improve stability and consistency of a data communications system.

DETAILED DESCRIPTIONS OF THE EMBODIMENTS

The following clearly and completely describes the technical solutions in the embodiments of the present application with reference to the accompanying drawings in the embodiments of the present application. Apparently, the described embodiments are merely some but not all of the embodiments of the present application.

In recent years, the intelligent driving assistance technology has been greatly developed. An intelligent driving assistance system detects and recognizes an external environment by using a laser radar sensor, a high definition camera sensor, a millimeter wave sensor, a combination navigation sensor, and an automotive networking system, to confirm a current state of a vehicle. With continuous development of a vehicle control technology, information exchange and sharing between traffic participants are implemented by means of vehicle-to-everything and a network technology by equipping an advanced artificial intelligence driving assistance system, and in cooperation with various apparatus such as a vehicle-mounted sensor, a controller, and an executor, so that a vehicle has functions such as sensing, decision planning, and control execution in a complex driving environment.

As the driving assistance system becomes more and more common and an entertainment system becomes increasingly complex, a requirement for bandwidth of an automotive network is increasingly high, and there is also a demand to reduce cable weights, leading to a trend of gradually replacing a conventional CAN bus by an automotive Ethernet technology.

An automotive Ethernet is a non-destructive arbitration communication network, and is also a new local area network technology that connects electronic units in a vehicle. Data transmission rates of 10 Mbit/s, 100 Mbit/s, and 1000 Mbit/s may be realized by using single unshielded twisted pair. Non-destructive arbitration technology means that when two or more different identifier nodes simultaneously send data to a bus, an identifier node having the highest priority may send data directly while data of an identifier node having a lower priority is directly returned and waits to be sent until the bus is idle.

The automotive Ethernet may significantly reduce system complexity, connection costs, and cabling weights, and may meet requirements of high reliability, low electromagnetic radiation, low power consumption, bandwidth allocation, low latency, synchronous real-time, and the like in the automotive industry.

Unlike a conventional Ethernet, the automotive Ethernet mainly improves a media access control (media access control, MAC) and a physical transceiver (physical transceiver, PHY). The MAC is generally integrated into a main chip of a microcontroller, because the PHY chip integrates a large quantity of analog hardware, but the MAC is a typical all-digital component. Considering a chip area and an analog/digital hybrid architecture, the PHY chip is usually disposed outside the main chip.

Figure 1:
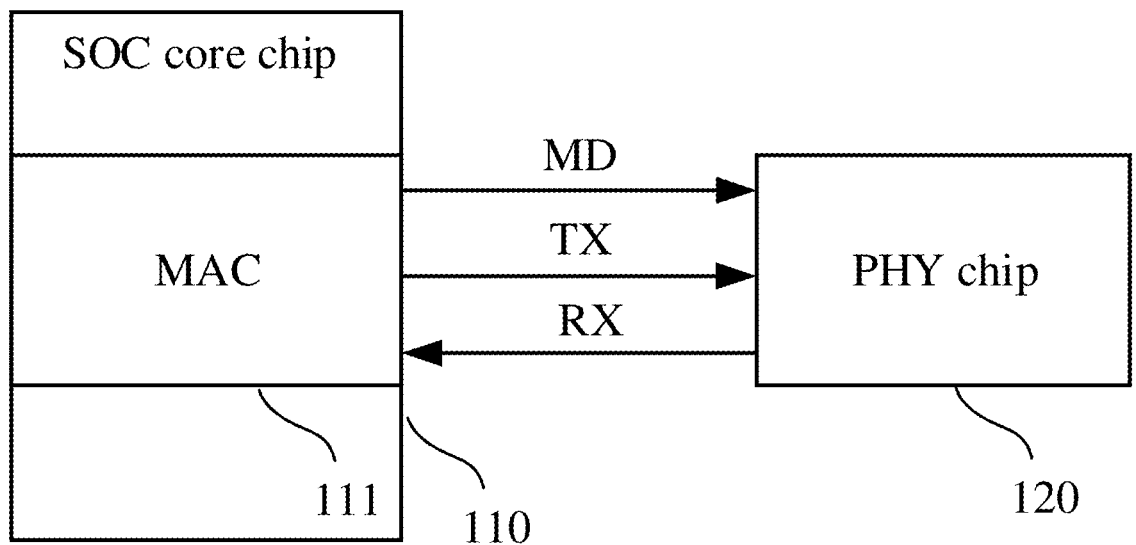
FIG. 1 is a schematic structural diagram of an automotive Ethernet system on chip.

FIG. 1 is a schematic structural diagram of an automotive Ethernet system on chip. As shown in FIG. 1, the automotive Ethernet system on chip is a system on chip (system on chip, SOC), and the SOC is also referred to as a system-level chip. The automotive Ethernet system on chip includes a SOC core chip 110 and a PHY chip 120, and a MAC chip 111 is integrated into the SOC core chip 110.

The MAC chip 111 may be defined by the Ethernet standard IEEE-802.3, and a data link layer is implemented. Currently, the MAC may simultaneously support rates of 10 Mbps, 100 Mbps, and 1000 Mbps. When sending or receiving data, the SOC core chip 110 determines, according to a MAC protocol, whether the data may be sent. If the data may be sent, some control information is added to the data, and finally the data and the control information are sent to the physical layer PHY chip 120 in a specified format. When data is to be received, input information is first determined and whether a transmission error occurs is determined according to the MAC protocol. If no error occurs, data with control information removed is sent to a logic link control (logic link control, LLC) layer.

Generally, a MAC chip in a SOC is connected to a PHY chip by using a reduced gigabit media independent interface (reduced gigabit media independent interface, RGMII). A plurality of groups of RGMII signals such as receiving data, sending data, and management configuration may be generally included between the MAC chip and the PHY chip. A clock signal frequency of the RGMII signals may be up to 125 MHz.

An automotive Ethernet system generally uses a printed circuit board (printed circuit board, PCB) structure to implement a function thereof. The printed circuit board is also referred to as a printed wiring board, a printed wiring card, or a PCB for short, which uses an insulating plate as a base material, and the plate is cut into a specific size, with at least one conductive pattern is attached thereto, and holes (for example, element holes, fastening holes, and metalized holes) to replace a chassis of an electronic component of a conventional apparatus, and implement interconnection between electronic components.

Generally, the automotive Ethernet has high frequency and fast transmission rate, and has a high signal quality requirement for large data transmission, which is sensitive to interference. Because the working environments inside and outside a vehicle are very complex and harsh, signal crosstalk and various electromagnetic signal interference between PCBs may occur, which causes a communication abnormality, and even causes a communication data loss of a laser radar sensor, a millimeter wave sensor, a SOC core chip, and the like.

Crosstalk is usually caused by coupling between two signal lines, mutual inductance and mutual accommodation between signals. When a signal propagates on a transmission line, an undesired noise voltage signal is generated between adjacent signal lines due to mutual coupling of an electromagnetic field, that is, energy is coupled from one line to another line. Crosstalk mostly occurs when a signal undergoes a transition, such as on a rising edge or a falling edge. Therefore, a high-frequency clock signal is more likely to interfere with another signal.

Therefore, there is a need for an appropriate anti-interference technology to deal with signal crosstalk between PCBs, to prevent serious error and ensure stability and consistency of a data communication function of an entire automotive network system.

On such a basis, an embodiment of the present application provides an automotive Ethernet circuit board. The following describes this embodiment of the present application in detail.

Figure 2:
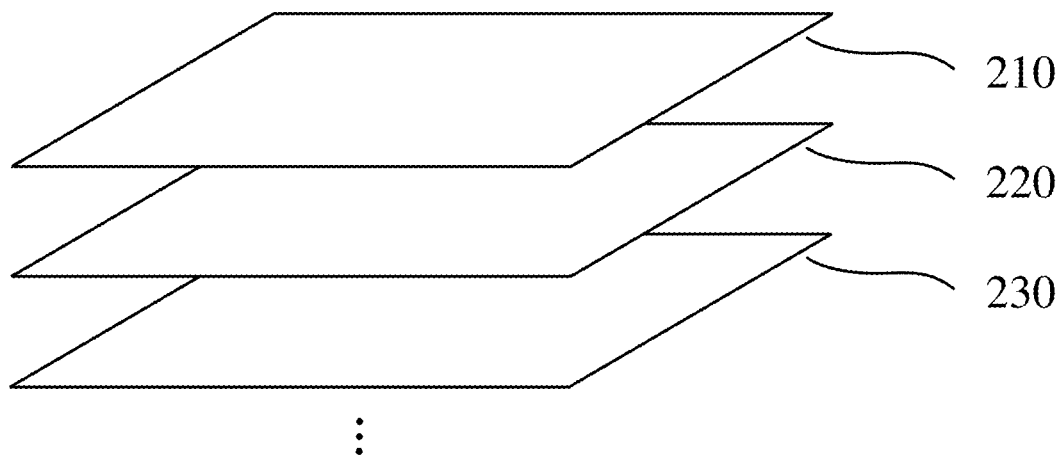
FIG. 2 is a schematic diagram of an automotive Ethernet circuit board according to an embodiment of the present application.

FIG. 2 is a schematic diagram of an automotive Ethernet circuit board according to an embodiment of the present application. As shown in FIG. 2, an automotive Ethernet system circuit board is of a multi-layer structure, and may include a component placement layer 210, a plurality of signal wiring layers 220, and a signal shielding layer 230.

The component placement layer 210 is configured to carry a PHY chip and a control chip of the PHY chip. The control chip of the PHY chip may be a SOC core chip. Generally, a MAC chip is integrated into the SOC core chip. The component placement layer 210 may be further configured to place various passive anti-interference components and the like.

The component placement layer 210 may be a single layer, or may include a plurality of layers. A multi-layer component placement layer 210 may include a first component placement layer and a second component placement layer, the first component placement layer may be any component placement layer, and the second component placement layer may be any component placement layer other than the first component placement layer. The first component placement layer may be adjacent to the second component placement layer, or may not be adjacent to the second component placement layer.

In some implementations, the first component placement layer and the second component placement layer may be respectively a top layer and a bottom layer of the automotive Ethernet circuit board. In some embodiments, the first component placement layer and the second component placement layer may be internal layers of the automotive Ethernet circuit board.

The plurality of signal wiring layers 220 are configured to carry signal wiring between components in the component placement layer 210. Key wiring of the automotive Ethernet circuit board is at the signal wiring layer. The plurality of signal wiring layers 220 may include a first signal wiring layer, and the first signal wiring layer may be any one of the plurality of signal wiring layers. The plurality of signal wiring layers may also include a second signal wiring layer, and the second signal wiring layer is a signal wiring layer, adjacent to the first signal wiring layer, in the plurality of signal wiring layers.

The signal shielding layer 230 is located between a plurality of signal wiring layers 220, and is configured to prevent interference in signal wiring, such as interference of a clock signal to another signal. The signal shielding layer is also referred to as a reference plane layer and a ground layer. The signal shielding layer 230 may include a plurality of layers, the signal shielding layer 230 may include a first signal shielding layer, and the first signal shielding layer is any one of the plurality of signal shielding layers. The signal shielding layer 230 may include a second signal shielding layer, and the second signal shielding layer is a signal shielding layer, adjacent to the first signal shielding layer, in the plurality of signal shielding layers. In some embodiments, to prevent inter-board signal crosstalk and interference of a clock signal to another signal, a complete signal shielding layer may generally be disposed next to each signal wiring layer.

In some implementations, the signal shielding layer 230 may include a first signal shielding layer and a second signal shielding layer, and both the first signal shielding layer and the second signal shielding layer are located between the first signal wiring layer and the second signal wiring layer. The first signal shielding layer is a reference plane layer of the first signal wiring layer, and the second signal shielding layer is a reference plane layer of the second signal wiring layer.

In some implementations, the first component placement layer and the second component placement layer may be respectively a top layer and a bottom layer of the automotive Ethernet circuit board. The first component placement layer is adjacent to the first signal wiring layer, and the second component placement layer is adjacent to the second signal wiring layer. Both the first signal shielding layer and the second signal shielding layer are located between the first signal wiring layer and the second signal wiring layer. In some embodiments, copper pouring processing is performed at the top layer and the bottom layer, and a ground plane of the top layer is connected to an adjacent first signal shielding layer, for example, the ground plane at the top layer and the first signal shielding layer may be connected together through dense vias. The ground plane at the bottom layer is connected to an adjacent second signal shielding layer, for example, the ground plane at the bottom layer and the second signal shielding layer may be connected together through dense vias. In this way, signal wiring may be stabilized to obtain better EMC performance.

Figure 7:
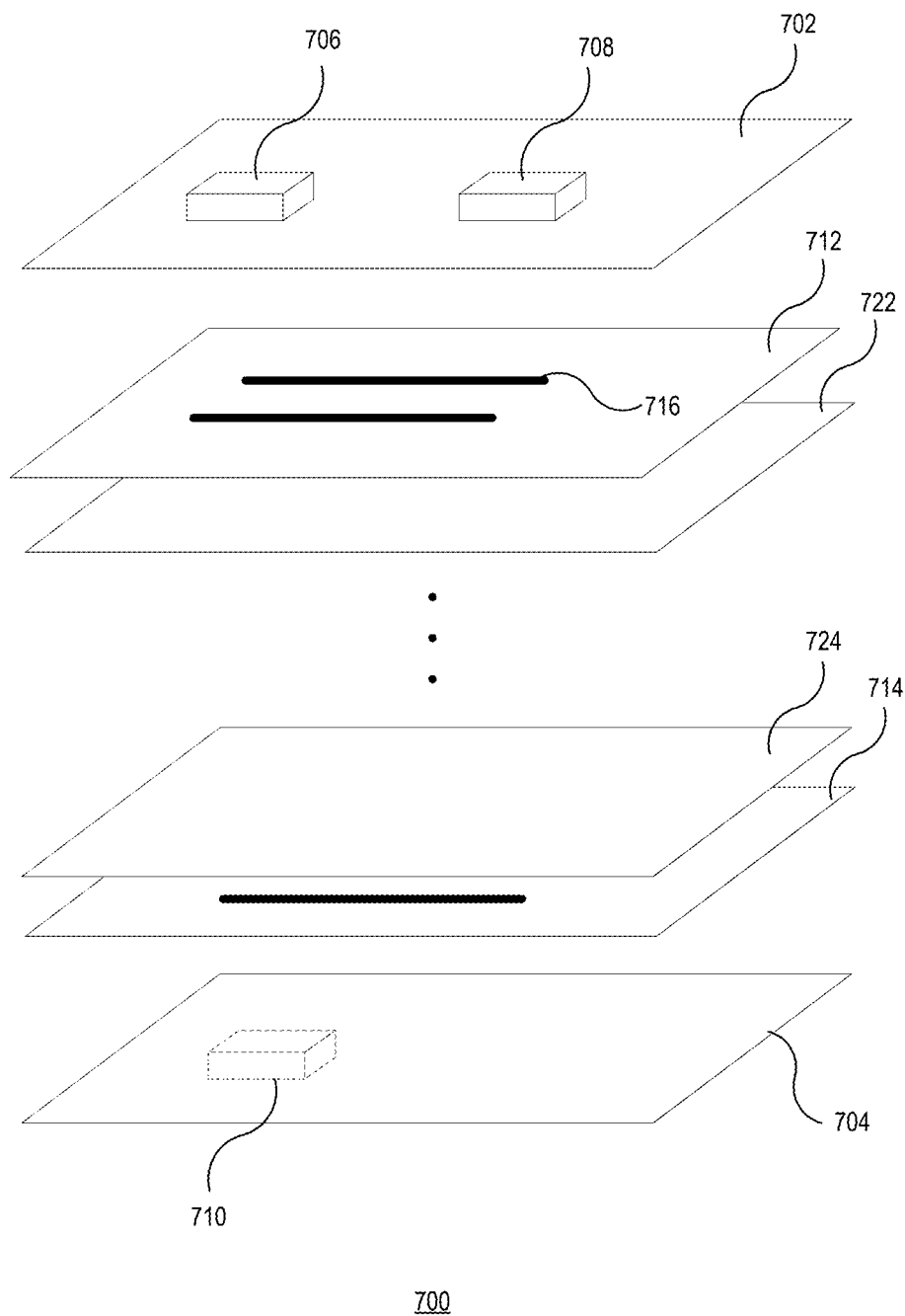
FIG. 7 is a schematic diagram of an automotive Ethernet circuit board according to an embodiment of the present application.

FIG. 7 is a schematic diagram of an automotive Ethernet circuit board according to an embodiment of the present application. As shown in FIG. 7, an automotive Ethernet system circuit board 700 includes a plurality of component placement layers (e.g., layers 702 and 704), a plurality of signal wiring layers (e.g., layers 712 and 714), and a plurality of signal shielding layers (e.g., layers 722 and 724). In this example, component placement layers 702 and 704 may be the top and bottom layer of circuit board 700, respectively. Each component placement layer may include one or more components mounted its surface. For example, components 706 and 708 are mounted on layer 702, and component 710 is mounted on layer 704. Each signal wiring layer may carry signal wiring comprising one or more signal lines, such as signal line 716 on signal wiring layer 712. Signal shielding layers 722 and 724 are located between signal wiring layers 712 and 714, with shielding layer 722 being the reference plane layer of wiring layer 712 and shielding layer 724 being the reference plane layer of wiring layer 714.

To facilitate description of the signal wiring layer 220 and the signal shielding layer 230, the following first describes communication between the MAC chip and the PHY chip.

The MAC chip on the component placement layer 210 is generally connected to the PHY chip by using an RGMII interface. RGMII adopts 4-bit data interface, with working clock of 125 MHz, and transmits data at both rising and falling edges. Therefore, the transmission rate may reach 1000 Mbps. The RGMII is also compatible with a working mode specified by a media independent interface (media independent interface, MII), and supports transmission rates of 10 20 Mbps, 100 Mbps, and 1000 Mbps, and corresponding clock signals of the RGMII are 2.5 MHz, 25 MHz, and 125 MHz, respectively.

Figure 3:
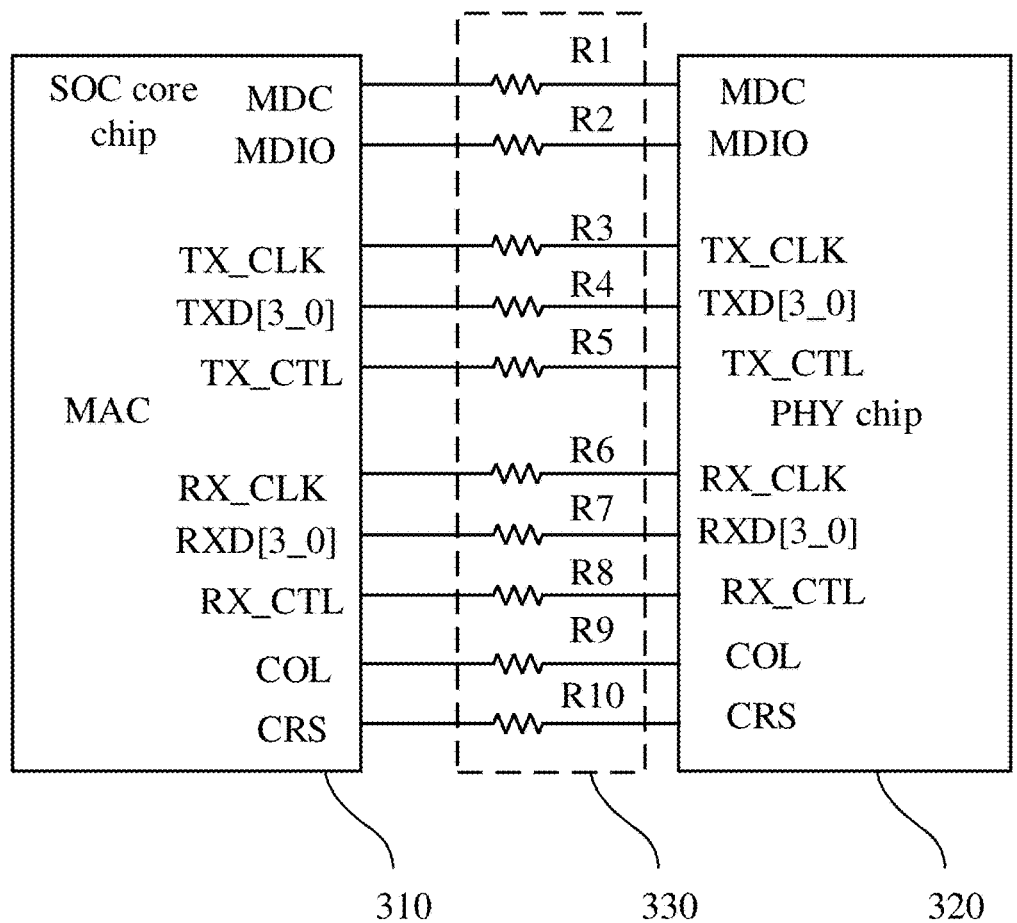
FIG. 3 is a schematic diagram of a communication connection between a PHY chip and a MAC chip.

FIG. 3 is a schematic diagram of a communication connection between a MAC chip and a PHY chip. As shown in FIG. 3, the automotive Ethernet system on chip includes a SOC core chip 310 and a PHY chip 320, and a MAC chip is integrated into the SOC core chip 310. RGMII signals between the MAC chip and the PHY chip may include signals RGMII-RX, signals RMII-TX, and signals RGMII-MD.

The signals RGMII-RX are receive data signals of the SOC core chip, and include a receive data clock signal RX_CLK, a receive data signal RXD[3_0], a receive control signal RX_CTL, a collision detection signal COL (used only in a half-duplex state), and a carrier monitoring signal CRS.

The signals RMII-TX are transmit data signals of the SOC core chip, and include a transmit data clock signal GTX_CLK, a transmit data signal TXD[3_0], and a transmit control signal TX_CTL. At a rate of 1000 Mbp/s, the SOC core chip provides an automotive Ethernet PHY chip with the signal GTX_CLK. The signals TXD[3_0] and TX_CTL are synchronized with the clock signal.

The signals RGMII-MD are management configuration (control and status information) signals of the SOC core chip, and include an MDC configuration interface clock and MDIO configuration interface data. The MDC is an aperiodic signal, and a minimum period of the signal (actually a sum of a positive level time and a negative level time) is 400 ns. A minimum positive level time and a minimum negative level time are 160 ns, and a maximum positive or negative level time is not limited. The MDIO is a bi-directional data cable configured to transmit the control information of the MAC layer and the state information of the physical layer. The MDIO data is synchronized with the MDC clock and is valid on the rising edge of the MDC.

Clock synchronization is very important because most of the components in a system operate on a clock transition edge. This requires that a delay difference of a clock signal is very small. Otherwise, a timing logic state error may occur. In addition, the clock signal is usually a signal with the highest frequency in the system, and is also a signal with the highest load. Therefore, the load should be properly distributed to ensure clock synchronization.

After receiving data from the RGMII interface, the automotive Ethernet PHY chip usually performs a 4B3B conversion and increases a clock frequency to 33.33333 MHz to maintain the bit rate of 100 Mbps. Then, the PHY chip needs to perform 3B2T operation, and convert three bits received each time into two ternary level values (a value range is −1, 0, 1). In this case, the clock cycle is still at 33.33333 MHz, but two levels in each clock cycle can be used to represent three bits. Therefore, in this case, the data rate is still 100 Mbit/s. Each level actually includes 1.5 bit information. To ensure data accuracy, an anti-interference measure needs to be added to a PCB design.

For the RGMII interface of the automotive Ethernet PHY chip 320, if a communication data bandwidth is 100 Mbps and a data width is 4 bit, the clock frequency is 25 MHz. To match different rates, such as a rate of 100 Mbit/s, in some implementations, an impedance matching circuit 330 is disposed between the PHY chip 320 and the core chip 310, as shown in the dotted line box in FIG. 3. For example, source impedance matching is performed on a data line and a clock transmit end, and impedance matching resistors are connected in series to meet a requirement for high-speed signal transmission. The impedance matching resistors connected in series may alternatively be a variable resistor, and a resistance value is slightly adjusted to ensure a characteristic impedance of 50 ohms as much as possible. The impedance matching circuit 330 may delay a rise/fall time of a signal line, and smooth an overshoot and an undershoot signal, so as to reduce a high-frequency harmonic amplitude of an output waveform, and effectively suppress a bit error rate of data communication.

As shown in FIG. 3, in the impedance matching circuit 330, each group of signal lines of RMII of the SOC core chip 310 is connected to the PHY chip 320 through matching resistors R1, R2, R3, . . . , R10, so that each signal line meets a requirement of single-end impedance matching.

In some implementations, an overall PCB of the automotive Ethernet uses a six-layer stacked design. A stacking design of an overall PCB is shown in Table 1. PCB1 layer L1 and PCB6 layer L6 are component placement layers 210, which are mainly configured to place a SOC core chip, a PHY chip, and various passive anti-interference components. PCB2 layer L2 and PCB5 layer L5 are signal wiring layers 220, and key wiring is designed at these layers. A signal shielding layer 230, namely, a reference plane layer, of the PCB2 layer L2 is PCB3 layer L3, and a signal shielding layer of the PCB5 layer L5 is PCB4 layer L4. Based on the signal shielding layers L2 and L5, an image layer is provided for a high-speed signal line. In a hardware anti-interference design, the transmission rate of the RGMII interface needs to be considered, especially the clock signals GTX_CLK and RX_CLK include various frequencies of 2.5 MHz, 25 MHz, and 125 MHz. To prevent interference of a clock signal to another signal, a complete signal shielding layer is disposed next to a PCB signal wiring layer for each group of wiring, for example, the PCB3 layer L3 and the PCB4 layer L4 shown in Table 1.

TABLE 1

| Layer identifier | PCB design requirement (oz/mil) | | | Copper foil type | Copper residual rate (%) Residual copper rate |
|---|---|---|---|---|---|
| | Cascade diagram | Media thickness | Cascade diagram | | |
| PCB1 layer L1 | 0.5 oz + plating | | | THE | 30.0 |
| | Component placement layer | 18 mil | PP (3313_RC59%*1) | | |
| PCB2 layer L2 | 1 oz | | | THE | 80.0 |
| | Signal wiring layer | 8 mil | Core (2313*1) | | |
| PCB3 layer L3 | 1 oz | | | THE | 30.0 |
| | Signal shielding layer | 18 mil | PP (2116_RC56%*2) | | |
| PCB4 layer L4 | 1 oz | | | THE | 80.0 |
| | Signal shielding layer | 18 mil | Core (2313*1) | | |
| PCB5 layer L5 | 1 oz | | | THE | 30.0 |
| | Signal wiring layer | 8 mil | PP (2116_RC56%*2) | | |
| PCB6 layer L6 | 0.5 oz + plating | | | THE | 80.0 |
| | Component placement layer | 18 mil | Core (2313*1) | | |

In the PCB design, an impedance requirement of single-end cabling may be adopted, for example, requiring that all PCB cables have a characteristic impedance wiring of 50 ohms. This helps the PHY chip to implement data communication of a standard automotive Ethernet, verify a capability of transmitting and receiving data in the automotive Ethernet, and ensure stability and signal integrity of the automotive Ethernet communication in an actual vehicle environment.

In some implementations, the signals RX_CLK, RXD[3_0], RX_CTL, COL, and CRS may be set as a first group of signals; signals GTX_CLK, TXD[3_0], and TX_CTL as a second group of signals; and the MDC configuration interface clock and MDIO configuration interface data as a third group of signals. During PCB wiring, a spacing of each group is not less than a specified spacing threshold. For example, the spacing threshold is 1 mm, so as to ensure that no direct interference occurs between the groups.

In some implementations, wiring in a group may be designed with equal lengths. For example, a length error is required to be controlled within a range of positive and negative 10 mil. This ensures that a data signal and a clock signal transmitted between the SOC core chip and the PHY chip are synchronized, and a case of data packet loss due to asynchronous data and clock is avoided.

In some implementations, it may be required that wiring is as short as possible in PCB cabling. For example, a capacitive load of the PCB cabling is less than 15 pF, so as to ensure that a high-speed pulse signal on a signal line is not distorted.

Optionally, a key chip in the PCB may not be arranged at a central position of the PCB, so as to ensure that a PCB deformation in a normal range does not affect welding of a component.

The automotive Ethernet circuit board in this embodiment of the present application is arranged in a multi-layer manner, a component placement layer for carrying a PHY chip and a core control chip is disposed, and a plurality of signal wiring layers are used to route signals between components in the component placement layer. Wirings between the PHY chip and a core control chip are spaced and arranged in groups, and a plurality of complete signal shielding layers are used to prevent interference of a clock signal in signal wiring. This embodiment of the present application helps reduce signal crosstalk between PCBs, prevent interference of a clock signal in signal wiring, and improve stability and consistency of a data communications system.

The automotive Ethernet circuit board further includes an automotive Ethernet interface, and the automotive Ethernet interface is connected to the PHY chip by using a differential signal line. A connection interface between two PHY chips is generally a media dependent interface (media dependent interface, MDI). During designing of automotive Ethernet wiring, to reduce connection cost and wiring weight, an unshielded twisted pair is usually used to connect the interfaces. However, high-speed transmission and unshielded twisted pair wiring of the automotive Ethernet may cause a large quantity of radiation noise, which greatly affects data transmission.

A differential signal means that a signal is transmitted in a positive level mode by one line and in a negative level mode by another line. When an interference signal occurs in the lines, impact on the two lines is the same, so that the interference signal may be prevented when a differential signal is restored at a receive end. Each pair of twisted pairs in the twisted pair is used to suppress interference signals and improve transmission quality.

Each pair of differential signal lines may include a first signal line and a second signal line for transmitting a differential signal. The first signal line is any signal line in the differential signal lines, and the second signal line is another signal line in the differential signal lines. For example, the first signal line is an MDIP signal line, and the second signal line is an MDIN signal line. For another example, the first signal line is an MDIN signal line, and the second signal line is an MDIP signal line.

Figure 4:
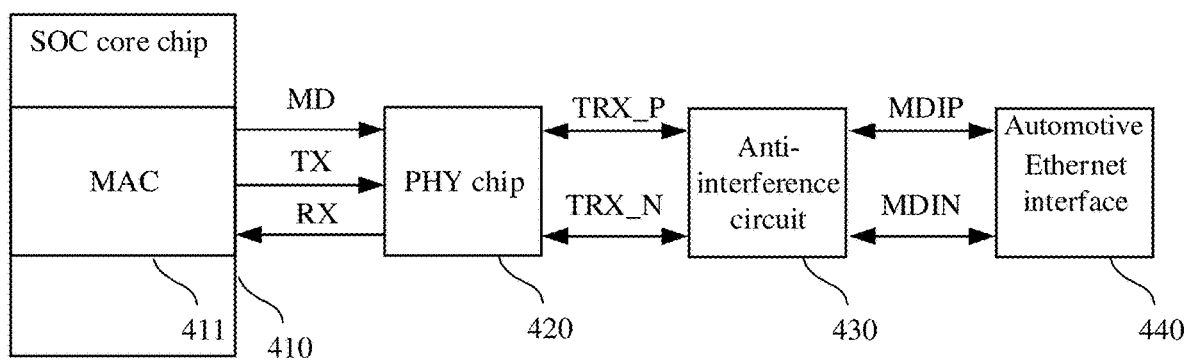
FIG. 4 is a schematic connection diagram of the circuit board in FIG. 2 in a possible implementation.

FIG. 4 is a schematic connection diagram of the circuit board in FIG. 2 in a possible implementation. In an automotive Ethernet system on chip in FIG. 4, an anti-interference circuit is disposed between a PHY chip and an automotive Ethernet interface. As shown in FIG. 4, the automotive Ethernet system on chip includes a SOC core chip 410, a PHY chip 420, an anti-interference circuit 430, and an Ethernet interface 440. A MAC chip 411 is integrated into the SOC core chip 410.

The anti-interference circuit 430 is located between the automotive Ethernet interface 440 and the PHY chip 420 and connected to the differential signal line, and configured to filter out an interference signal from transmission signals in the differential signal line. As shown in FIG. 4, the anti-interference circuit 430 is connected to the Ethernet interface 440 a differential signal line that includes the MDI positive (MDIP) and MDI negative (MDIN) signals. The Ethernet interface 440 is connected to an external sensor device by using a dedicated automotive Ethernet twisted pair cable. In addition, the anti-interference circuit 430 is connected to the PHY chip 420 by using different signal lines, including the transmit positive and negative signals (TX_P and TX_N) and the receive positive and negative signals (RX_P and RX_N). For simplicity of illustration, the transmit and receive signals are combined as TRX_P and TRX_N.

The anti-interference circuit 430 may include one or more of the following circuits: a common mode filter circuit, a coupling circuit, a low-pass filter circuit, and an anti-static circuit, where the common mode filter circuit is configured to filter out a common mode interference signal; the coupling circuit is configured to filter out a direct current bias signal; the low-pass filter circuit is configured to filter out a high-frequency interference signal; and the anti-static circuit is configured to eliminate an external transient high-voltage electrostatic interference signal and a surge signal. The automotive Ethernet interface anti-interference circuit is formed by passive electronic components, which are simple in structure and low in costs, and may be applied to anti-interference design of various automotive Ethernet interfaces.

Generally, an analog circuit part such as an MDI transceiver in the PHY chip 420 of the automotive Ethernet has a relatively high requirement for power supply quality. In some implementations, a power supply filter circuit may further be disposed at a power inlet end of the PHY chip. The power supply filter circuit is connected to the PHY chip to filter out a high-frequency interference signal received by a power supply of the PHY chip. The power supply filter circuit may be a low-pass filter circuit, for example, may be a π-type low-pass filter circuit. In some embodiments, a magnetic bead may be used as a filter of a power supply. Because magnetic bead L1 has a high resistivity and magnetic conductivity, signal interference may be suppressed, and a high-frequency signal may be absorbed.

In some embodiments, in a PCB design phase, the power supply filter circuit is disposed as close to a power pin and a ground pin of the PHY chip of the automotive Ethernet as possible, so as to ensure better filtering effect.

Figure 5:
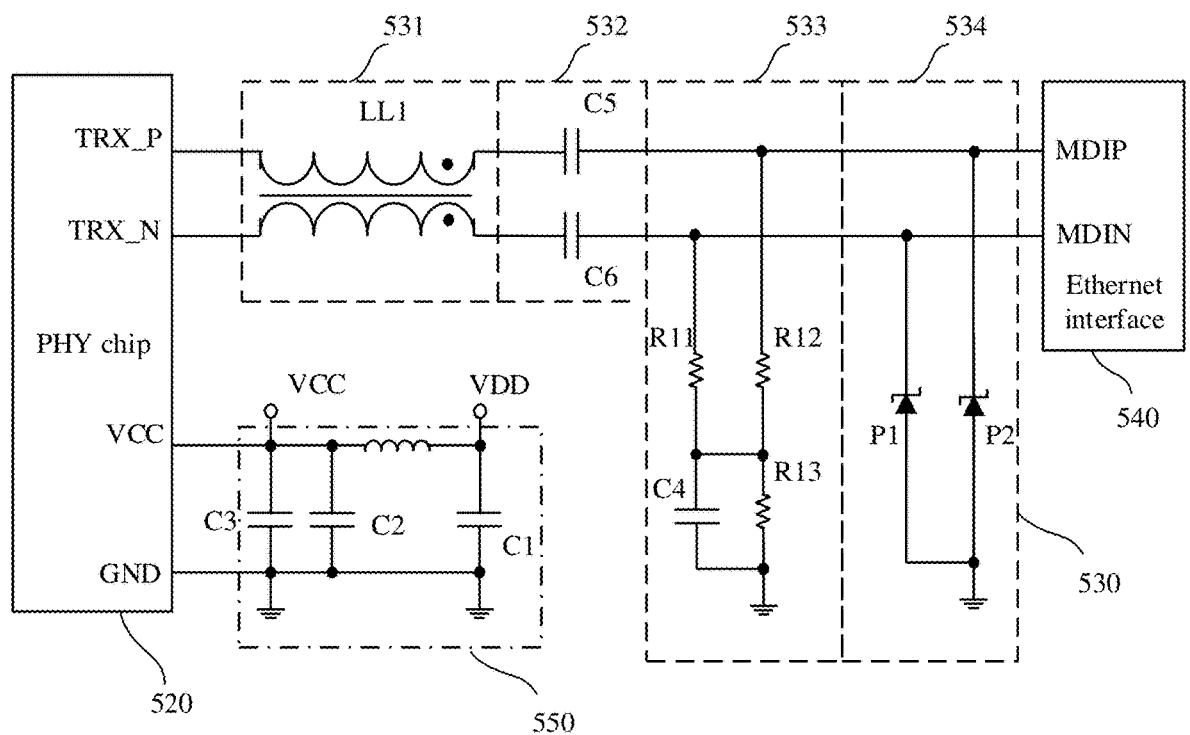
FIG. 5 is a schematic diagram of an anti-interference circuit 430 in FIG. 4 in a possible implementation.

FIG. 5 is a schematic diagram of an anti-interference circuit 430 in FIG. 4 in a possible implementation. As shown in FIG. 5, the automotive Ethernet system on chip may include a PHY chip 520, an anti-interference circuit 530, an Ethernet interface 540, and a power supply filter circuit 550.

As shown in the dashed line box of FIG. 5, the anti-interference circuit 530 may include a common mode filter circuit 531, a coupling circuit 532, a low-pass filter circuit 533, and an anti-static circuit 534.

In some implementations, in an automotive Ethernet interface anti-interference circuit, the common mode filter circuit 531 may include a common mode choke LL1. The coupling circuit 532 may include AC coupling capacitors C5 and C6. The low-pass filter circuit 533 may include R11, R12, R13, and C4. The anti-static circuit 534 may include ESD protection components P1 and P2. The following describes the working process of each module in detail.

A specific working process of the common mode filter circuit is as follows.

When a data signal arrives at the common mode choke LL1, as there are two coil groups with opposite winding directions inside the common mode choke LL1, two magnetic fields that cancel each other are generated according to Fara'ay's electromagnetic induction law. In this case, a working current is mainly affected by an ohmic resistance of a coil and a small amount of damping caused by a leakage inductance at a negligible working frequency. If any another interference signal flows through the coils, the coils present a high impedance, which results in a strong damping effect and attenuates the interference signal. Therefore, the interference signal may be effectively eliminated by selecting an appropriate LL1 to filter data transmission frequency of the automotive Ethernet. In this way, the LL1 may transmit a differential mode signal, and both a DC signal and a common mode signal with a low frequency may pass through, but a large impedance is presented for high-frequency common mode noise. Thus, the LL1 may be used to suppress common mode current interference.

A specific working process of the coupling circuit is as follows.

A DC component loaded on a data signal may be isolated and eliminated by using the AC coupling capacitors C5 and C6. Because a capacitor is characterized by conducting an AC signal and isolating a DC signal, any DC interference signals that are not required are eliminated by C5 and C6. Based on filtering combined by the LL1 and C5 and C6, the common mode interference signal and DC component are jointly eliminated. This process is bidirectional filtering, that is, both input and output signals may be effectively filtered. A high insertion loss characteristic and a micro mode conversion characteristic are implemented, so that good noise suppression effect and high immunity performance that meet an automotive Ethernet standard can be implemented.

As shown in FIG. 5, main transmission differential lines in this part may use a strict differential equal-length design in PCB design. For example, the PCB design requires that each wiring from the PHY chip to the LL1, from the LL1 to C5 and C6, from C5 and C6 to the Ethernet interface 540 may have a differential impedance of 100Ω and is designed strictly with equal length, because a differential impedance deviation directly affects reflection of some input signal portions. A reflection condition of a signal is measured by using a parameter return loss (return loss, RL). A larger absolute value of the return loss is, better transmission effect is obtained, and vice versa.

In some implementations, the differential wiring of the PCB should be as short as possible to ensure that a signal capacity load at a differential end is less than 10 pF, and a signal transmission delay caused by a single-end signal wiring is less than 1 ns, thereby ensuring stable and high-speed signal transmission.

A differential signal line includes a first signal line and a second signal line that are used to transmit a differential signal. In some implementations, a low-pass filter circuit may include a first resistor, a second resistor, a third resistor, and a first capacitor, which are respectively corresponding to R11, R12, R13, and C4 in FIG. 5. As shown in FIG. 5, a first terminal of the first resistor is connected to a first signal line, a second terminal of the first resistor is connected to a first terminal of the first capacitor, a second terminal of the first capacitor is connected to the ground, a first terminal of the second resistor is connected to a second signal line, a second terminal of the second resistor is connected to a first terminal of the third resistor, a second terminal of the third resistor is connected to the ground, and the second terminal of the first resistor is connected to the second terminal of the second resistor.

In some implementations, a design of the low-pass filter circuit 533 in the automotive Ethernet interface anti-interference circuit may be analyzed with reference to a transmission data waveform diagram. When no anti-interference circuit is disposed, in a transmission process of data signals, some signals are greatly attenuated in amplitude due to noise signal interference, while some signals become chaotic due to forward interference, resulting in a decrease in useful signals and an increase in noise signals. Thus, a waveform is irregular and lacks consistency, thereby increasing a bit error rate of signal transmission.

A specific working process of the low-pass filter circuit is as follows.

The low-pass filter circuit 533 is shown in FIG. 5, where various interference signals coupled to lines are coupled to the signal ground via R12 and R13. The R11 converts a transient level to a current to charge C4. In this case, a noise signal on the R12 reaches 1 V, which is not enough to rebound the signal to a main differential line. Thus, the whole circuit keeps an original stable state. The R13 may act as a fuse to protect the entire circuit. An interference waveform is directly coupled to the signal ground, that is, an external abnormal interference source may be isolated by appropriately selecting allowable powers of R12 and R13.

Due to transient effect of the interference source and other conditions that cannot be considered, sawtooth waveforms on a data signal cannot be completely eliminated. When these sawtooth waveforms are large enough, frequency doubling effect is formed. Therefore, in designing of a circuit, it may be important to increase C4. A selection of a value of C4 has specific reference value. The value of C4 should not be too large, as it would increase filtering effect, but also reduce a rate of change of external data received by the circuit. On the other hand, the value of C4 should not be too small, as it would not fulfill its intended purpose. Therefore, in some embodiments, the value of C4 may be selected at about 10 nF according to an input impedance of the main differential line. In this way, a charge/discharge time constant of C4 is about 0.1 K×10 nF, which may meet a requirement of effectively eliminating AC interference.

A detailed working process of the anti-static circuit is as follows.

P1 and P2 use electro-static discharged protection (electro-static discharged protection, ESD) with a low capacitance value, so as to prevent a high voltage ranging from 5 kV to 15 kV or more. Based on such an anti-interference circuit with different protection levels, an anti-interference capability of the circuit may be improved, which is proved to be effective in practice.

As shown in a dotted box in FIG. 5, a power supply filter circuit 550 is further disposed at a power inlet end of the PHY chip 520, so as to filter out a high-frequency interference signal received by the power supply of the PHY chip. The power supply filter circuit 550 may form a π-type low-pass filter circuit by using a high-frequency impedance characteristic of an inductive component such as a magnetic bead and in cooperation with capacitors C1, C2, and C3, to perform power supply filtering processing on a power pin of the PHY chip 520. In addition, high-frequency signal interference of the PHY chip 520 to an external power supply may be reduced.

Optionally, in a PCB design phase, a π-type low-pass filter circuit may be disposed as close to a power pin and a ground pin of the PHY chip of the automotive Ethernet as possible, so as to ensure relatively good filtering effect.

The automotive Ethernet circuit board in this embodiment of the present application is arranged in a multi-layer manner, a component placement layer for carrying a PHY chip and a core control chip is disposed, and a plurality of signal wiring layers are used to route signals between components in the component placement layer. Wirings between the PHY chip and a core control chip are spaced and arranged in groups, and a plurality of complete signal shielding layers are used to prevent interference of a clock signal in wiring. In this embodiment of the present application, an interface anti-interference circuit is added between a back terminal of a PHY chip and an Ethernet interface to control various potential interference signals in a targeted manner, so that a common mode interference signal, a DC offset signal, various high-frequency signal interference, external transient high-voltage electrostatic interference, and the like may be filtered out. This embodiment of the present application helps reduce signal crosstalk between PCBs, prevent interference of a clock signal in wiring, filter out electromagnetic radiation interference on an unshielded twisted pair, and improve stability and consistency of a data communications system.

Figure 6:
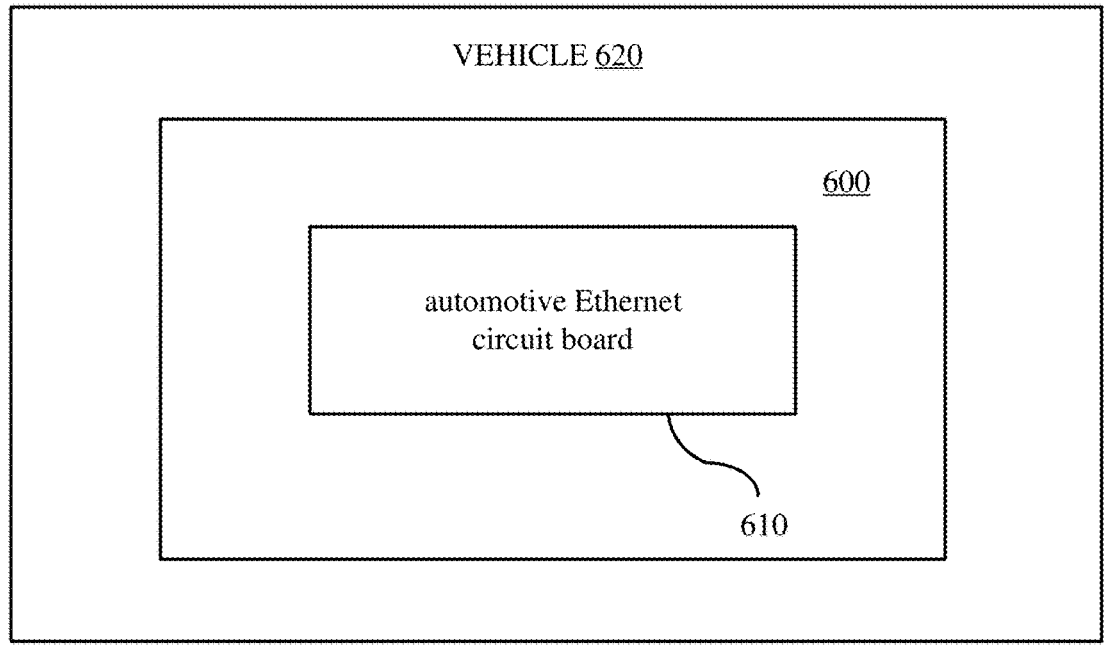
FIG. 6 is a schematic diagram of an automotive Ethernet communications system according to an embodiment of the present application.

FIG. 6 is a schematic diagram of an automotive Ethernet communications system according to an embodiment of the present application. As shown in FIG. 6, the automotive Ethernet communications system 600 may include the automotive Ethernet circuit board 610 described in any of the foregoing descriptions.

An embodiment of the present application further provides a vehicle 620, including the automotive Ethernet communications system 600 described in any of the foregoing descriptions.

It should be understood that, in various embodiments of the present application, "first", "second", and the like are used to distinguish from different objects, and are not used to describe a specific sequence. Sequence numbers of the foregoing processes do not mean execution sequences. The execution sequences of the processes should be determined according to functions and internal logic of the processes, and should not be construed as any limitation on the implementation processes of the embodiments of the present application.

In several embodiments provided in the present application, it should be understood that, the disclosed system, apparatus, and method may be implemented in other manners. For example, the described apparatus embodiments are merely examples. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatus or units may be implemented in electronic, mechanical, or other forms.

In the several embodiments provided in the present application, it should be understood that when a part is referred to as being "connected" or "connected" to another part, it means that the part may not only be "directly connected", but also "electrically connected", and another element intervenes. In addition, the term "connection" also means "physical connection" and "wireless connection" of the portion. In addition, when a part is referred to as "include" an element, it means that the part may include another element, not exclude another element, unless otherwise stated.

The units described as separate components may be or may not be physically separated, and the components displayed as units may be or may not be physical units, that is, may be located in one place or distributed on a plurality of network units. Some or all of the units may be selected according to actual needs to achieve the objective of the solutions of the embodiments.

In addition, function units in the embodiments of the present application may be integrated into one processing unit, or each of the units may exist alone physically, or two or more units may be integrated into one unit.

The foregoing descriptions are merely specific implementations of the present application, but the protection scope of the present application is not limited thereto. Any variation or replacement readily figured out by a person skilled in the art within the technical scope disclosed in the present application shall fall within the protection scope of the present application. Therefore, the protection scope of the present application shall be subject to the protection scope of the claims.

What is claimed is:

1. An automotive Ethernet circuit board, comprising:
a component placement layer, configured to carry a PHY chip and a control chip of the PHY chip;
a plurality of signal wiring layers, configured to carry signal wiring between components in the component placement layer;
a signal shielding layer, located between the plurality of signal wiring layers and configured to prevent interference of a clock signal in the signal wiring layer;
an automotive Ethernet interface electrically connected to the PHY chip via a differential signal line; and
an anti-interference circuit, located between the automotive Ethernet interface and the PHY chip, electrically connected to the differential signal line, and configured to filter out an interference signal from transmission signals in the differential signal line.

2. The automotive Ethernet circuit board according to claim 1,
wherein the plurality of signal wiring layers comprise a first signal wiring layer and a second signal wiring layer;
wherein the signal shielding layer comprises a first signal shielding layer and a second signal shielding layer;
wherein the first signal shielding layer and the second signal shielding layer are both located between the first signal wiring layer and the second signal wiring layer;
wherein the first signal shielding layer is a reference plane layer of the first signal wiring layer; and
wherein the second signal shielding layer is a reference plane layer of the second signal wiring layer.

3. The automotive Ethernet circuit board according to claim 1, wherein the anti-interference circuit comprises one or more of:
a common mode filter circuit, configured to filter out a common mode interference signal;
a coupling circuit, configured to filter out a direct current bias signal;
a low-pass filter circuit, configured to filter out a high-frequency interference signal; and
an anti-static circuit, configured to eliminate an electrostatic interference signal.

4. The automotive Ethernet circuit board according to claim 1, further comprising an impedance matching circuit is disposed between the PHY chip and the control chip.

5. The automotive Ethernet circuit board according to claim 2,
wherein the component placement layer comprises a first component placement layer and a second component placement layer;
wherein the first component placement layer and the second component placement layer are a top layer and a bottom layer of the automotive Ethernet circuit board, respectively;
wherein the first component placement layer is adjacent to the first signal wiring layer; and
wherein the second component placement layer is adjacent to the second signal wiring layer.

6. The automotive Ethernet circuit board according to claim 3, wherein the anti-interference circuit further comprises:
a power supply filter circuit, connected to the PHY chip and configured to filter out a high-frequency interference signal received by a power supply of the PHY chip.

7. The automotive Ethernet circuit board according to claim 3,
wherein the differential signal line comprises a first signal line and a second signal line for transmitting differential signals;
wherein the low-pass filter circuit comprises a first resistor, a second resistor, a third resistor, and a first capacitor;
wherein a first terminal of the first resistor is connected to the first signal line;
wherein a second terminal of the first resistor is connected to a first terminal of the first capacitor;
wherein a second terminal of the first capacitor is connected to the ground;

wherein a first terminal of the second resistor is connected to the second signal line;
wherein a second terminal of the second resistor is connected to a first terminal of the third resistor;
wherein a second terminal of the third resistor is connected to the ground; and
wherein the second terminal of the first resistor is connected to the second terminal of the second resistor.

8. An automotive Ethernet communications system, comprising an automotive Ethernet circuit board, wherein the automotive Ethernet circuit board comprises:
a component placement layer, configured to carry a PHY chip and a control chip of the PHY chip;
a plurality of signal wiring layers, configured to carry signal wiring between components in the component placement layer;
a signal shielding layer, located between the plurality of signal wiring layers and configured to prevent interference of a clock signal in the signal wiring layer;
an automotive Ethernet interface, electrically connected to the PHY chip via a differential signal line; and
an anti-interference circuit, located between the automotive Ethernet interface and the PHY chip, electrically connected to the differential signal line, and configured to filter out an interference signal from transmission signals in the differential signal line.

9. The automotive Ethernet communications system of claim 8,
wherein the plurality of signal wiring layers comprise a first signal wiring layer and a second signal wiring layer;
wherein the signal shielding layer comprises a first signal shielding layer and a second signal shielding layer;
wherein the first signal shielding layer and the second signal shielding layer are both located between the first signal wiring layer and the second signal wiring layer;
wherein the first signal shielding layer is a reference plane layer of the first signal wiring layer; and
wherein the second signal shielding layer is a reference plane layer of the second signal wiring layer.

10. The automotive Ethernet communications system of claim 8, wherein the anti-interference circuit comprises one or more of:
a common mode filter circuit, configured to filter out a common mode interference signal;
a coupling circuit, configured to filter out a direct current bias signal;
a low-pass filter circuit, configured to filter out a high-frequency interference signal; and
an anti-static circuit, configured to eliminate an electrostatic interference signal.

11. The automotive Ethernet communications system of claim 8, wherein an impedance matching circuit is disposed between the PHY chip and the control chip.

12. The automotive Ethernet communications system of claim 9,
wherein the component placement layer comprises a first component placement layer and a second component placement layer;
wherein the first component placement layer and the second component placement layer are a top layer and a bottom layer of the automotive Ethernet circuit board, respectively;
wherein the first component placement layer is adjacent to the first signal wiring layer; and
wherein the second component placement layer is adjacent to the second signal wiring layer.

13. The automotive Ethernet communications system of claim 10, wherein the anti-interference circuit further comprises:
a power supply filter circuit, connected to the PHY chip and configured to filter out a high-frequency interference signal received by a power supply of the PHY chip.

14. The automotive Ethernet communications system of claim 13,
wherein the differential signal line comprises a first signal line and a second signal line for transmitting differential signals;
wherein the low-pass filter circuit comprises a first resistor, a second resistor, a third resistor, and a first capacitor;
wherein a first terminal of the first resistor is connected to the first signal line;
wherein a second terminal of the first resistor is connected to a first terminal of the first capacitor;
wherein a second terminal of the first capacitor is connected to the ground;
wherein a first terminal of the second resistor is connected to the second signal line;
wherein a second terminal of the second resistor is connected to a first terminal of the third resistor;
wherein a second terminal of the third resistor is connected to the ground; and
wherein the second terminal of the first resistor is connected to the second terminal of the second resistor.

15. A vehicle comprising an automotive Ethernet communications system, wherein the automotive Ethernet communications system comprises an automotive Ethernet circuit board comprising:
a component placement layer, configured to carry a PHY chip and a control chip of the PHY chip;
a plurality of signal wiring layers, configured to carry signal wiring between components in the component placement layer;
a signal shielding layer, located between the plurality of signal wiring layers and configured to prevent interference of a clock signal in the signal wiring layer;
an automotive Ethernet interface, electrically connected to the PHY chip via a differential signal line; and
an anti-interference circuit, located between the automotive Ethernet interface and the PHY chip, electrically connected to the differential signal line, and configured to filter out an interference signal from transmission signals in the differential signal line.

16. The vehicle of claim 15,
wherein the plurality of signal wiring layers comprise a first signal wiring layer and a second signal wiring layer;
wherein the signal shielding layer comprises a first signal shielding layer and a second signal shielding layer;
wherein the first signal shielding layer and the second signal shielding layer are both located between the first signal wiring layer and the second signal wiring layer;
wherein the first signal shielding layer is a reference plane layer of the first signal wiring layer; and
wherein the second signal shielding layer is a reference plane layer of the second signal wiring layer.

17. The vehicle of claim 16,
wherein the component placement layer comprises a first component placement layer and a second component placement layer;

wherein the first component placement layer and the second component placement layer are a top layer and a bottom layer of the automotive Ethernet circuit board, respectively;
wherein the first component placement layer is adjacent to the first signal wiring layer; and
wherein the second component placement layer is adjacent to the second signal wiring layer.

\* \* \* \* \*